United States Patent
Ravi et al.

(10) Patent No.: US 12,125,697 B2
(45) Date of Patent: Oct. 22, 2024

(54) INTEGRATED METHOD FOR LOW-COST WIDE BAND GAP SEMICONDUCTOR DEVICE MANUFACTURING

(71) Applicant: ThinSiC Inc., Santa Clara, CA (US)

(72) Inventors: Tirunelveli Subramaniam Ravi, San Jose, CA (US); Bishnu Gogoi, Scottsdale, AZ (US)

(73) Assignee: ThinSiC Inc., Santa Clara, CA (US)

( * ) Notice: Subject to any disclaimer, the term of this patent is extended or adjusted under 35 U.S.C. 154(b) by 0 days.

(21) Appl. No.: 18/386,571

(22) Filed: Nov. 2, 2023

(65) Prior Publication Data

US 2024/0063013 A1    Feb. 22, 2024

Related U.S. Application Data

(63) Continuation of application No. 17/533,516, filed on Nov. 23, 2021, now Pat. No. 11,848,197.

(60) Provisional application No. 63/119,541, filed on Nov. 30, 2020.

(51) Int. Cl.
 *H01L 21/02* (2006.01)
(52) U.S. Cl.
 CPC .. *H01L 21/02019* (2013.01); *H01L 21/02271* (2013.01); *H01L 21/02389* (2013.01)
(58) Field of Classification Search
 None
 See application file for complete search history.

(56) References Cited

U.S. PATENT DOCUMENTS

| | | |
|---|---|---|
| 6,770,507 B2 | 8/2004 | Abe et al. |
| 7,238,941 B2 | 7/2007 | Tai et al. |
| 7,790,226 B2 | 9/2010 | Tai et al. |
| 9,878,397 B2 | 1/2018 | Hirata et al. |
| 10,084,038 B2 | 9/2018 | Vecino Vazquez et al. |
| 10,304,739 B2 | 5/2019 | Nishibayashi et al. |
| 10,562,130 B1 | 2/2020 | Donofrio et al. |
| 10,576,585 B1 | 3/2020 | Donofrio et al. |
| 10,612,157 B2 | 4/2020 | Kubota et al. |
| 10,755,946 B2 | 8/2020 | Hirata et al. |
| 10,784,339 B2 | 9/2020 | Vecino Vazquez et al. |
| 10,825,733 B2 | 11/2020 | Bhalla et al. |
| 10,828,726 B2 | 11/2020 | Hirata et al. |

(Continued)

FOREIGN PATENT DOCUMENTS

WO    WO2020150511    7/2020

*Primary Examiner* — Alexander G Ghyka (57) ABSTRACT

A method for manufacturing a wide band gap semiconductor device using a substrate of SiC wafer is disclosed. The method includes coating the substrate with a hard mask material, performing lithography to define patterned openings in the hard mask material of the substrate, etching the substrate to form patterned trenches from the defined patterned openings, removing the hard mask using a chemical process from the substrate, cleaning the substrate with the patterned trenches, performing epitaxy on the substrate to form a uniform single crystal layer over the patterned trenches to create a plurality of micro voids, kiss polishing the substrate, performing another epitaxy on the substrate using a fast epitaxial growth process to provide an active device epitaxial layer suitable to fabricate SiC devices, and after fabrication of the SiC devices, severing the plurality of micro voids to extract the SiC devices from the substrate of the SiC wafer.

10 Claims, 8 Drawing Sheets

(56) References Cited

U.S. PATENT DOCUMENTS

| | | |
|---|---|---|
| 10,870,176 B2 | 12/2020 | Hirata |
| 10,872,757 B2 | 12/2020 | Hirata |
| 10,872,758 B2 | 12/2020 | Hirata |
| 10,903,078 B2 | 1/2021 | Schulze et al. |
| 10,978,311 B2 | 4/2021 | Drescher et al. |
| 11,031,483 B2 | 6/2021 | Schulze et al. |
| 11,081,393 B2 | 8/2021 | Beyer et al. |
| 11,211,459 B2 | 12/2021 | Brockmeier et al. |
| 11,848,197 B2 * | 12/2023 | Ravi .................. H01L 21/0254 |
| 2003/0056718 A1 | 3/2003 | Kawahara et al. |
| 2003/0186475 A1 * | 10/2003 | Ueda ................. H01L 21/76251 |
| | | 438/22 |
| 2004/0048091 A1 * | 3/2004 | Sato ................. H01L 21/76254 |
| | | 438/455 |
| 2009/0108403 A1 * | 4/2009 | Gogoi .................... H01L 28/91 |
| | | 257/532 |
| 2016/0322493 A1 * | 11/2016 | Wang ................. H01L 21/0245 |
| 2019/0280085 A1 | 9/2019 | Brault et al. |
| 2021/0225659 A1 | 7/2021 | Drescher et al. |
| 2021/0225709 A1 | 7/2021 | Rieske et al. |
| 2024/0006242 A1 * | 1/2024 | Ravi .................. H01L 21/02433 |
| 2024/0006243 A1 * | 1/2024 | Ravi .................. H01L 21/0243 |

* cited by examiner

INTEGRATED METHOD FOR LOW-COST WIDE BAND GAP SEMICONDUCTOR DEVICE MANUFACTURING

CROSS REFERENCE

This application is a continuation of U.S. application Ser. No. 17/533,516 entitled "Integrated Method For Low-Cost Wide Band Gap Semiconductor Device Manufacturing" filed on Nov. 23, 2021, the contents of which are hereby incorporated by reference. U.S. application Ser. No. 17/533,516 entitled "Integrated Method For Low-Cost Wide Band Gap Semiconductor Device Manufacturing" claims priority from provisional patent application 63/119,541 entitled "Integrated Approach to Low Cost Wide Band Gap Semiconductor Device Manufacturing" filed on Nov. 30, 2020. Said application is incorporated herein by reference.

FIELD OF INVENTION

This invention relates to methods for manufacturing semiconductors in power electronics and, in particular, to methods for manufacturing wide bandgap semiconductors with substrate cost reduction.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) has now been increasingly used for high voltage drivers (>1200V) whereas Gallium Nitride (GaN) has been experiencing increased use in both higher power and higher frequency applications. However, unlike silicon, the cost of a final device for WBG semiconductor devices is dominated by the cost of the materials. The materials include the substrate and the active layer grown by Epitaxy. The substrate by itself contributes to over half of the cost of a finished WBG semiconductor device.

From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with ingot growth followed by ingot cropping, then wire sawing of individual wafers, and finally grinding and polishing of the substrate, and as of now, there has been no proven practical method to eliminate any of these foregoing steps.

As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate is paramount while also maintaining low defect densities in the active epitaxial layer. To date, there have been mainly two approaches to reduce the substrate contribution to the die cost while maintaining the low defect density.

The first approach is the growth of larger substrates. A number of companies have commercialized the 150 mm SiC substrates with reduced defects and there are also efforts underway to further increase the substrate size to 200 mm. However, the 200 mm SiC is expected to take several more years before it can be commercialized. Much of the wafer size increases depends on development and deployment of next generation crystal growth systems.

The second approach is extraction of substrates kerflessly from the ingot. There are a couple of procedures that are currently being explored and implemented. The first procedure involves creating a subsurface damage layer using a femtosecond laser and using the subsurface damage layer as a cleave plane for extracting a wafer above it by methods such as cold splitting whereby a sudden thermal shock will enable the cleavage. A second procedure is a well-known SOITEC method called SmartCut™ for wafer splitting approach whereby Hydrogen is implanted in the substrate to create a damage zone and a thermal shock is applied to extract the wafer remaining above the damage zone.

However, neither of these approaches has thus far been readily commercialized due to yield losses arising during the cleaving process. Moreover, the process of creating a damage layer below the surface by either a femtosecond laser or H2 ion implantation can result in a damage layer no deeper than 150 microns that limits extraction of wafers that are greater than 150 microns. Notwithstanding the 150 microns limitation, it is, as yet, unclear if meaningful semiconductor devices can be made with such thin SiC wafers.

Accordingly, it is desirable to provide methods to manufacture WBG semiconductors that overcome the thin substrate limitation and reduce the contribution of the substrate to the final die with minimal effect to the yield or performance parameters of the final WBG semiconductor.

SUMMARY OF INVENTION

In accordance to an embodiment of the present invention, a method to manufacture wide band gap semiconductors using a substrate of SiC wafer is disclosed. The method steps include coating the substrate with a hard mask material, performing lithography to define patterned openings in the hard mask material of the substrate, etching the substrate to form patterned trenches with reentrant profiles from the defined patterned openings, removing the hard mask using a chemical process from the substrate, cleaning the substrate with the patterned trenches, performing a buffer epitaxy on the substrate to form a uniform single crystal layer over the patterned trenches to create a plurality of micro voids, an optional kiss polishing of the substrate, performing another epitaxy on the substrate using a fast epitaxial growth process to provide an active device epitaxial layer with high quality suitable to fabricate SiC devices, and after fabrication of the SiC devices, severing the two epitaxial layers with the device layer at the plurality of micro voids.

In accordance to another embodiment of the present invention, the hard mask material is a layer of silicon nitride and the coating step includes chemical vapor deposition.

In accordance to another embodiment of the present invention, the step of performing lithography includes the step of using photoresist for pattern transfer of the patterned openings to the substrate.

In yet another embodiment of the present invention, the step of etching the substrate includes the step of reactive ion etching to etch the hard mask and the patterned openings to form reentrant trenches. The reactive ion etching can be isotropic to enable a reentrant profile after a first anisotropic etch. This ensures microvoids after the epitaxial growth.

In a further embodiment of the present invention, the step of performing epitaxy includes the step of using Merged Epitaxial Lateral Overgrowth (MELO) to form the uniform single crystal layer over the patterned trenches to create the plurality of micro voids.

In yet another embodiment of the present invention, the step of using MELO includes the step of fast buffer layer epitaxial growth to an epitaxial layer thickness of 5-20 micrometers.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

One aspect of the present invention is an integrated method to partially fabricate a device on a thin epitaxially grown wide bandgap substrate material that is loosely attached to a nano-patterned SiC substrate, and extract an individual die or multitudes of dies from the substrate followed by completion of the final device method steps with a thin device attached to a handle substrate. Another aspect of the present invention describes a method to pattern a surface layer on a SiC substrate that can be used as a cleave layer for extraction of a fabricated device. Yet another aspect of the present invention is a method to grow a thin lateral Epitaxial overgrowth layer on the surface patterned layer to present a defect free surface to grow a device Epitaxial layer. Another aspect of the present invention is to use a nano-patterned Silicon carbide wafer as a template for SiC and GaN crystal growth and using the weakened nano-patterned layer to extract full SiC and GaN wafers kerflessly from the SiC substrate. The SiC substrate is then subsequently reused.

Figure 1A:
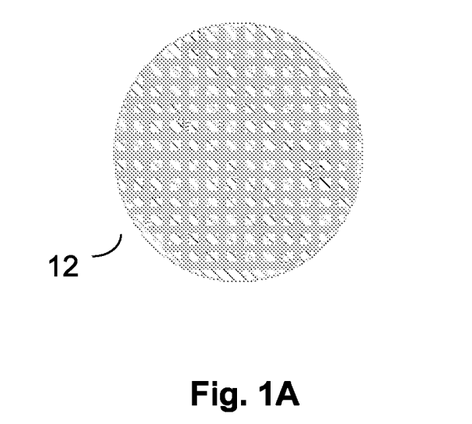
FIG. 1A illustrates a 4H-Silicon carbide (SiC) single crystal substrate in accordance to the present invention.

FIG. 1A illustrates an example 4H-Silicon carbide (SiC) single crystal substrates or SiC wafer 12. The 4H—SiC substrate is then patterned with an array of openings that may have different shapes: square, rectangles, stripes and the like. The orientation of the openings to the crystalline structure may be made to optimize the subsequent lateral epitaxial growth that is performed in a subsequent step in the formation of the substrate in accordance with the present invention. As an example, the pattern etch can show up as triangles or hexagons exposing (1120) or equivalent Crystal planes of 4H—SiC. These orientations afford formation of fast lateral epitaxial overgrowth to enable subsequent high quality vertical epitaxy on the (0001) plane while creating subsurface voids underneath. In addition, the spacing between the openings may be optimized to facilitate the high-quality epitaxial growth as well as minimize the force required to exfoliate the substrate in a subsequent step of the fabrication process in accordance to the present invention. The spacing of the openings may be in the range of 20 nm to several microns. In the example embodiment, the 4H—SiC single crystal substrates include a plurality of hard mask 100 nm squares with 50 nm gaps between the hard mask squares. FIG. 1A illustration is not to scale.

Figure 1B:
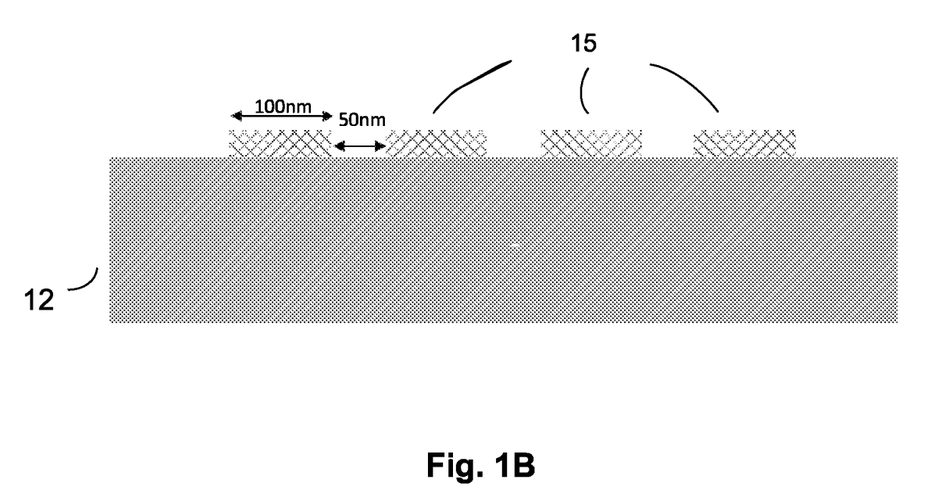
FIG. 1B illustrates a side view of the 4H—SiC single crystal substrate in accordance to the present invention.

FIG. 1B illustrates a side view of the 4H—SiC single crystal substrates having a thickness of 300-350 microns. A plurality of 100 nm hard mask squares 15 are shown with 50 nm gaps above the 4H—SiC single crystal substrate 12. In accordance to the present invention, the substrate is a polished 4H—SiC wafer off cut by 4 or 8 degrees. As shown in FIGS. 1A and 1B, the SiC wafer 12 is first coated with a hard mask 15 for a subsequent lithography and etching step. Those skilled in the art will understand that the choice of materials for the hard mask 15 is determined by the etching process that is incorporated during the processing. In accordance to the present invention, the material for the hard mask is a layer of silicon nitride or aluminum oxide or similar material. The method of deposition may be CVD (Chemical Vapor Deposition), ALD (Atomic Layer Deposition) or similar method.

A next step in the present invention is a lithography step to define the openings in the hard mask 15 and subsequently in the SiC substrate. The pattern transfer is implemented using photoresist and conventional optical lithography or by non-conventional lithography such as electron beam or Nano-imprint lithography. The openings can be of different shapes such as lines and spaces forming a grating structure. In accordance to another embodiment, the openings in the hard mask can be squares or rectangles. In yet another embodiment, the openings in the hard mask may be hexagonal or triangle or diamond shaped positioned in plane and patterned in such a way that the exposed vertical planes after vertical RIE (Reactive Ion Etch) etching will be of the (1120) type. In any case, the size and shape of the openings in the hard mask and subsequently in the substrate are to afford lateral overgrowth of the crystalline structure in a subsequent process step. The size of the openings defined by the lithography step may be between 10 nanometers to 1 micrometer.

Figure 2A:
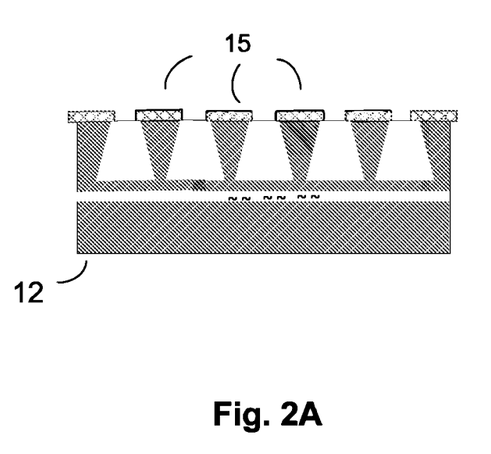
FIG. 2A illustrates openings defined in the SiC substrate by a lithography step in accordance to the present invention.

FIG. 2A illustrates the opening defined by the lithography step. Once openings are defined by the lithography process, the hard mask is etched using a RIE (Reactive Ion Etch). In accordance to the present invention, if the hard mask is silicon nitride, a fluorine chemistry RIE process may be used to etch the hard mask. Accordingly, chemistries such as SF6, CHF3, CF4, and similar gases may be used for etching the hard mask. Once the hard mask is etched, an etch process is used to etch through the open areas to form trenches in the underlying SiC substrate. A RIE etch process can be used with an ICP (Inductively Coupled Plasma) to form reentrant profiles with columnar walls. In another embodiment of the present invention, the trench formation in the underlying SiC substrate can be accomplished using electrochemical or anodic etching. As evident to those skilled in the art, the method of electrochemical etching can be used to vary the geometry of the trench opening by varying the current density, bias voltage, spacing between electrodes, power or multiple parameters simultaneously. Accordingly, it is possible to define trenches that are narrower in the top and wider at the bottom, similar to a re-entrant profile achieved with a RIE process. It is also possible to combine a RIE step with anodic oxidation to achieve trenches with narrower openings on the top and wider openings on the bottom. In accordance to an embodiment of the present invention, the depth of the trenches can be between 1-3 micrometers.

In a next step of the present invention, the hard mask 15 is removed using a chemical process. If the hard mask material is silicon nitride, the chemical process to remove the hard mask is fuming phosphoric acid.

After the hard mask is removed from the surface of the wafer, the next step is to clean the substrate prior to the epitaxial growth. The cleaned substrate with the array of patterned trenches on the surface is placed in an epitaxial growth reactor for the deposition of SiC.

Figure 2B:
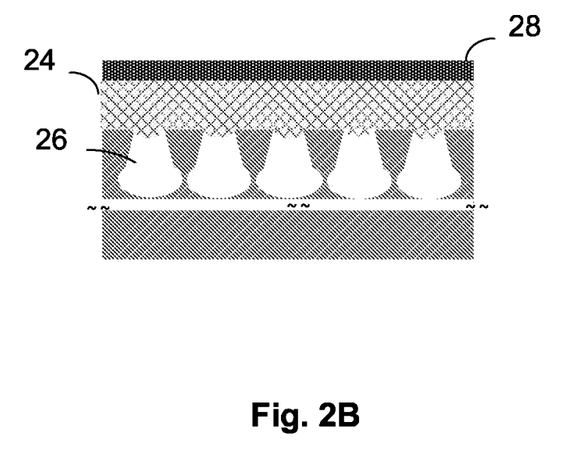
FIG. 2B illustrates a patterned SiC substrate with layers of Epitaxial Lateral Overgrowth in accordance to the present invention.

Referring to FIG. 2B, after the cleaning of the patterned SiC substrate 12, the epitaxial process of crystal growth is used to form a uniform single crystal layer 24 over the patterned substrate. In accordance to an embodiment of the present invention, the single crystal layer 24 or buffer epitaxial layer 24 is a thick N+ growth between 5-20 microns thick. The method of ELO (Epitaxial Lateral Overgrowth) or MELO (Merged Epitaxial Lateral Overgrowth) can be used by adjusting the growth conditions of the epitaxial fronts to merge and form a uniform single crystal layer over the trenches formed earlier which are now sealed below the surface of the merged epitaxial layer. The sealed trenches form a region of intentionally formed micro voids 26 that are used in subsequent process steps to exfoliate the top epitaxial layer from the substrate. The substrate can then be reused multiple times. It will be evident to those skilled in the art that by adjusting the growth conditions, a low defect layer of ELO can be formed, which then serves as the template for the subsequent epitaxial growth for the die substrate and device formed in subsequent fabrication steps.

After formation of the buffer epitaxial layer 24 and the array of micro voids 26 serving as the exfoliation or separation layer below the surface, another layer of device epitaxial SiC 28 is grown using an epitaxial active layer growth process. In accordance to an embodiment of the present invention, the buffer epitaxial layer 24 is a thick N+ fast Epi 4HSiC epi layer. The device epitaxial SiC layer 28 is typically a N− active layer Epi 4HSiC Epi growth. The thickness of the buffer epitaxial layer 24 is to provide a means to make an ohmic contact for the final device structure. The thickness of the buffer epitaxial layer 24 is about 5-20 micrometers. Prior to the layer of device epitaxial 28 growth, a light polishing step known as a kiss polish may be needed to prepare the surface of the substrate having the buffer epitaxial layer 24.

In accordance to an embodiment of the present invention, the thick buffer epitaxial layer 24 is grown using standard CVD epitaxial growth process or modified bulk crystal growth process such as High Temperature CVD or by Physical Vapor Transport (PVT) process. The formation of the device epitaxial layer 28 can be followed by epitaxial growth of another layer that is suitable for the formation of SiC devices. The thickness of the device epitaxial layer 28 is determined by the breakdown voltage of the device that is formed in this layer. For an example 1200V device, the thickness of the device epitaxial layer is about 10-12 micrometers.

In accordance to an embodiment of the present invention, the formation of the device epitaxial layer 28 over the buffer epitaxial layer 24 completes the substrate 12 preparation prior to the formation of semiconductor devices. Any devices fabricated can use standard fabrication processes and designs.

Figure 3A:
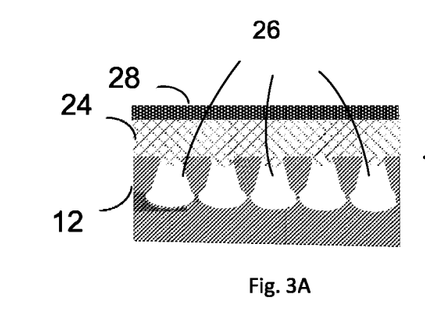
FIG. 3A illustrates the substrate film stack with the SiC layers ready for fabrication of a Schottky barrier diode in accordance to the present invention.
Figure 3B:
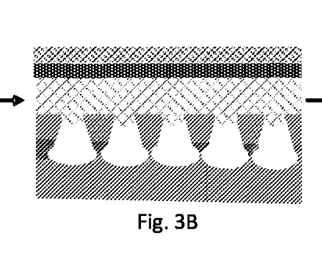
FIG. 3B illustrates a step in the Schottky barrier diode fabrication where the substrate film stack is coated with photoresist for lithography in accordance to the present invention.
Figure 3C:
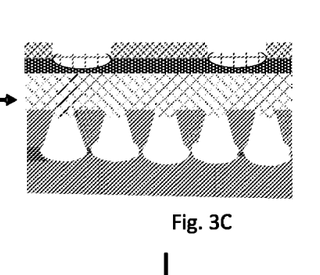
FIG. 3C illustrates another step in the fabrication of the Schottky barrier diode where the photoresist is patterned using lithography followed by P+ ion implant, removal of the photoresist and an activation anneal to drive in the dopants in accordance to the present invention.
Figure 3D:
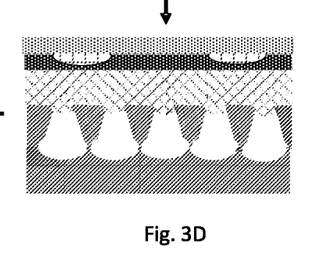
FIG. 3D illustrates another step in the device fabrication with the deposition of the Schottky barrier metal in accordance to the present invention.
Figure 3E:
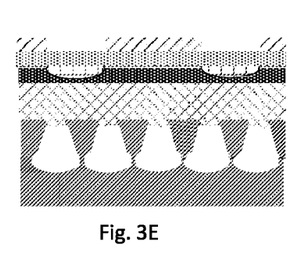
FIG. 3E illustrates yet another step in the Schottky barrier diode fabrication with the deposition of top side metal contact and lithography for patterning of the top side metal layer in accordance to the present invention.
Figure 3F:
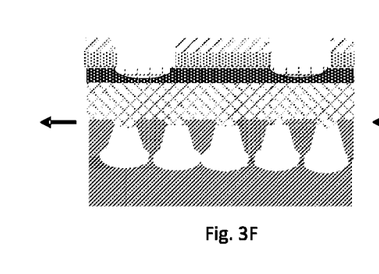
FIG. 3F illustrates the patterning of the top side metal contact layer with a selective metal etch in accordance to the present invention.

FIGS. 3A-3F illustrates a generalized process for fabrication of a SiC Schottky barrier diode on the prepared substrate. All the process steps are carried out upon the active device epitaxial layer 28 on the substrate 12. In FIG. 3B, resist is deposited on the substrate film stack and baked. Next, in FIG. 3C, the resist is patterned using a lithography mask and developed followed by P+ ion implant and an activation anneal is performed to drive in the dopants from the implant. FIG. 3D cleans off resist and deposits Schottky barrier metal. In FIG. 3E, deposit, expose, and develop resist for metal contact on the top side of the device is patterned using photoresist patterning, and developing. FIG. 3F performs selective metal etch.

Figure 4A:
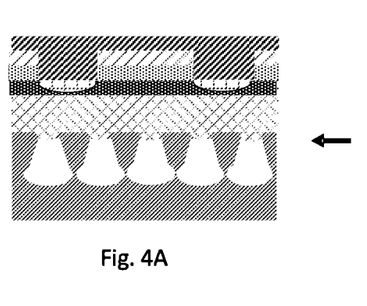
FIG. 4A illustrates another step in the fabrication of the Schottky barrier diode where a thick silicon oxide is deposited on the surface of the substrate in accordance to the present invention.
Figure 4B:
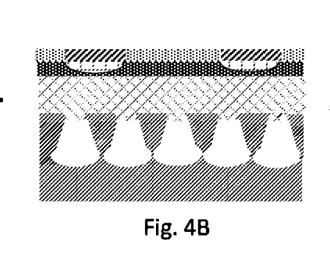
FIG. 4B illustrates another step in the fabrication of the Schottky barrier diode where resist patterning for lift off is performed with the patterned etch of the silicon oxide layer in accordance to the present invention.
Figure 4C:
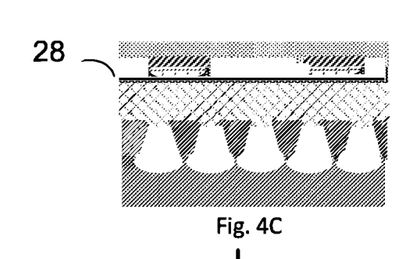
FIG. 4C illustrates yet another step in the fabrication of the Schottky barrier diode with the metal deposition and lift-off for forming the front side metal contact in accordance to the present invention.
Figure 4D:
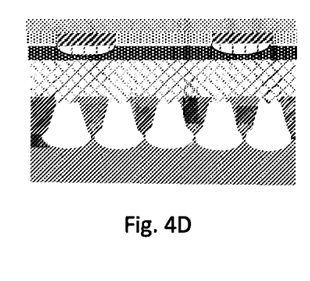
FIG. 4D illustrates the multi-die singulation by laser to separate individual dies from the substrate in accordance to the present invention.
Figure 4E:
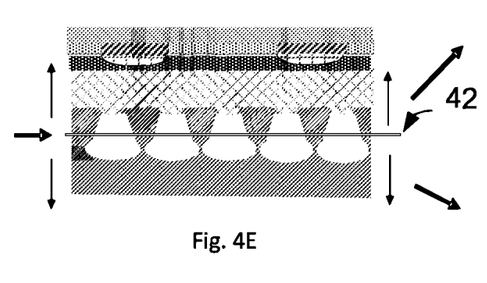
FIG. 4E illustrates the mechanical separation of the substrate with the die or the partially completed device layer along an axis parallel to the substrate surface in accordance to the present invention.
Figure 4F:
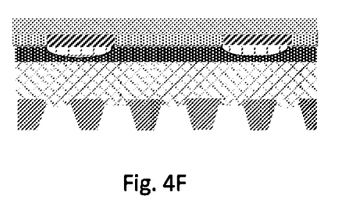
FIG. 4F illustrates the full device layer or dies separated from the substrate and ready for final back metal contact and ohmic contact formation in accordance to the present invention.
Figure 4G:
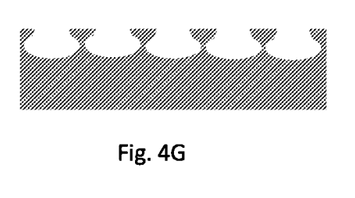
FIG. 4G illustrates the original substrate being reclaimed after mechanical separation and ready for reuse in accordance to the present invention.

FIGS. 4A-4G continues the generalized process for fabrication of the SiC Schottky barrier diode described in FIGS. 3A-3F. In FIG. 4A, thick Silicon oxide is deposited onto the substrate. In FIG. 4B, resist patterning for lift off is performed. In FIG. 4C, metal deposition is deposited to form the front contacts. FIG. 4D performs multi-die singulation by laser to separate individual dies from the substrate. Optionally, the entire partially completed device layer can be released from the substrate. In FIG. 4E, mechanical separation of the substrate with the die or the entire partially completed device layer is performed along an axis depicted by arrow 42. The full device layer or the individual die with the Schottky device is separated from substrate by first attaching it to a separate structure such as a portable electrostatic chuck or by using an adhesive attached to a rigid handle. In FIG. 4F, the full device layer or dies are separated from the substrate and is and now ready for a final back metal deposition and ohmic contact formation. Since the exfoliated device layer or die is now attached to a rigid handle, the back side of the device layer or individual dies can be cleaned and readied for the back metal ohmic contact formation and back metal deposition. Once the back metallization is completed the device is fully completed. At this point, the entire device layer or the individual dies are attached to a so-called blue dicing tape. In the case of the entire device layer being attached to the blue dicing tape, next the singulation of the individual dies can happen. Now the dies are ready for testing and sorting. In FIG. 4G, the remaining substrate is reclaimed and reused.

Referring to FIGS. 4D-4G, just before the device is completed on the device epitaxial layer 28, the die or multitudes of dies or the substantially finished device is singulated or severed from the SiC substrate 12. Arrow 42 shows the patterned layer along with the array of micro-voids 26 created below the ELO that serves as the release layer or exfoliating layer for the extraction of the dies from the substrate 12. Since the depth of the singulation cut is 15-80 micrometers, edge release exfoliating layer can be done by use laser or dicing saw. The singulation process to complete the release of the die or collection of dies or the entire wafer can be completed with a vacuum chuck, electrostatic chuck or by use of water jet splitter impinging on the edge of the wafer in the plane of the exfoliating layer formed by the array of micro-voids 26 below the ELO epitaxial layer.

In accordance to an embodiment of the present invention, a next step in the process is cleaning the top wafer or die or collection of dies using a simple chemical process. The backside metal ohmic contact is formed by metal deposition followed by annealing such as laser annealing. This is followed by the deposition of a thicker metal which effectively becomes the back metal contact. The thicker metal may be formed by sputtering, evaporation, electro-plating and similar methods. The details of the fabrication process for the devices are defined by the specific semiconductor devices that are formed in the device epitaxial layer. The specific steps required for the formation of diodes, MOSFETs and similar devices are well known to those skilled in the art. The finished devices are then tested and sorted based on their performance.

After the completion of the devices and extraction of the die or wafer from the substrate is completed, the severed or exfoliated substrate is re-polished and reclaimed for subsequent usage. The severed substrate that is left after the extraction of the completed semiconductor devices using the exfoliation process with the micro-voids, can be reused multiple times for subsequent device fabrication. Chemical mechanical polishing or electrochemical polishing is performed to ready the reclaimed substrate for reuse. The ability to reclaim wafers for multiple device formation using the exfoliation method described in an embodiment of the present reduces the cost of SiC device formation by a significant amount while also improving the performance by reducing the RDSON (drain-source on resistance) contribution from the bulk epitaxial thickness layer, in addition to the improved thermal dissipation capability of the device, thereby improving overall reliability.

In accordance to another embodiment of the present invention, the patterned substrate with the exfoliating layer of micro-voids can be used as a seed surface for thick SiC epi/wafer growth. After growing about 200-400 micrometers of SiC, the edges can be released to separate the epitaxial wafer from the substrate. Since a bulk crystal growth can be used on the patterned seed surface, the cost of such bulk grown wafers with almost zero kerf loss would be significantly lower than conventional approaches. The bulk growth for SiC includes PVT (Physical Vapor Transport) and High Temperature Chemical Vapor Deposition (HTCVD).

In accordance to yet another embodiment of the present invention, the device layer can be a GaN layer directly grown on patterned silicon carbide and processed into the final device before being singulated and exfoliated from the SiC substrate. In cases where thin GaN layers need to be transferred to high thermal conductivity substrates, using this approach lends itself to ease of layer transfer. By incorporating an GaN epitaxial lateral overgrowth process, the dislocation density in the final structure can be reduced further.

Figure 5A:
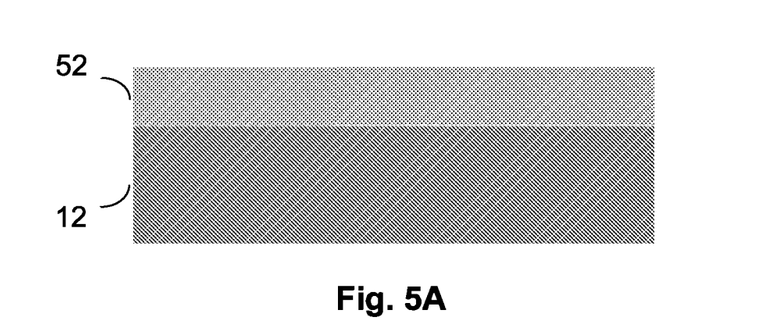
FIG. 5A illustrates a thick layer of GaN grown epitaxially on a SiC substrate in accordance to the present invention.

In accordance to an embodiment of the present invention with reference to FIG. 5A, the substrate layer can be a thick 40-50 microns layer of GaN (Gallium Nitride) 52 grown epitaxially on a SiC 12 substrate then the layer of GaN 52 becomes the starting substrate for formation of a patterned exfoliating layer for GaN devices. An advantage is that as the GaN 52 layer grows thicker, dislocation density on the surface is reduced and subsequent patterning further reduces the dislocation density to ~1E4/cm2 level.

Figure 5B:
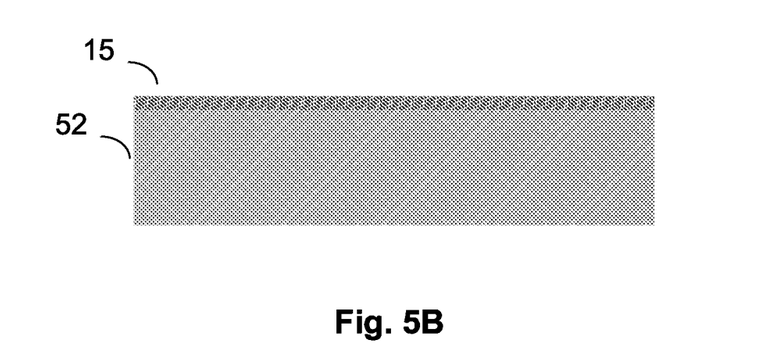
FIG. 5B illustrates the thick layer of GaN coated with a hard mask material on the GaN substrate in accordance to the present invention.

Referring to FIG. 5B, the starting substrate of GaN 52 on SiC 12 of FIG. 5A is cleaned and then coated with a hard mask material 15. In accordance to an embodiment of the present invention, the hard mask material 15 is Silicon Nitride, which is deposited using a CVD (Chemical Vapor Deposition) process such as LPCVD (Low Pressure Chemical Vapor Deposition).

Figure 5C:
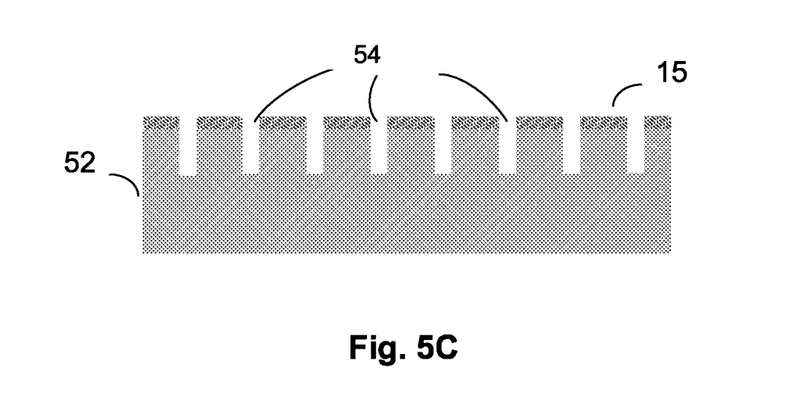
FIG. 5C illustrates a pattern for formation of an exfoliating layer on the GaN substrate in accordance to the present invention.

Referring to FIG. 5C, a pattern for formation of an exfoliating layer is fashioned in subsequent process steps. The pattern definition for formation of the exfoliating layer is accomplished using photo resist and conventional optical lithography or non-conventional lithography such as electron beam lithography or by Nano-imprint lithography. Once a pattern is transferred to the photo resist, the hard mask 15 is etched using RIE (Reactive Ion Etching). A fluorine chemistry such as SF6 may be used for the etching of the hard mask. The underlying substrate of GaN on SiC is then etched to form trenches 54 which may be 1000-5000 Angstroms in depth. The pattern that is transferred may be in the form of lines, hexagons, squares and other shapes which aid the subsequent process of ELO (Epitaxial Lateral Overgrowth). The size of the openings may be in the range of 500-5000 Angstroms. The width and depth of the trenches formed in the GaN layer may be adjusted based on the requirements of the subsequent ELO process.

Figure 6A:
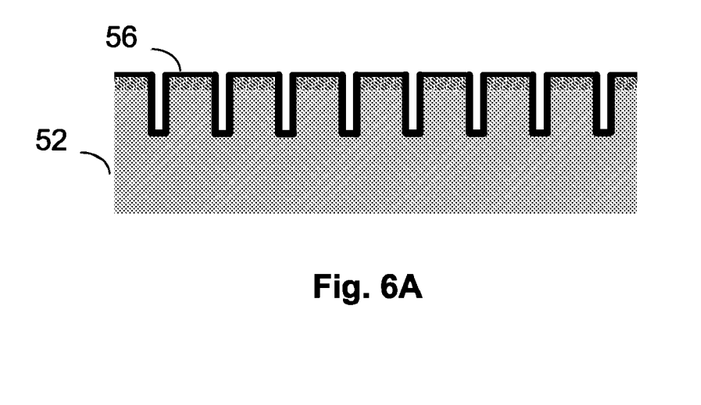
FIG. 6A illustrates deposition of a conformal material over the formation of the exfoliating layer in accordance to the present invention.

Once the array of trenches 54 has been formed in the GaN substrate 52, FIG. 6A illustrates deposition of a conformal material 56 over the GaN substrate 52. The conformal material 56 that is deposited is a LPCVD Silicon Nitride layer. Other materials such as LPCVD Oxide, HTO (high temperature oxide), LTO (Low temperature oxide), TEOS (Tetra Ethyl Ortho Silicate) may be used for the conformal material 56. An important aspect is that the conformal material coats the sidewalls of the array of trenches in a conformal manner. In addition, the conformal layer may be deposited using ALD (Atomic Layer Deposition). ALD layers such as AlN, Al2O3 may be used for the conformal layer. In the exemplary embodiment, the conformal material 56 is a LPCVD silicon nitride layer. The thickness of the LPCVD silicon nitride layer is between 500-1000 Angstroms and can be determined by the process designer based on related fabrication steps.

Figure 6B:
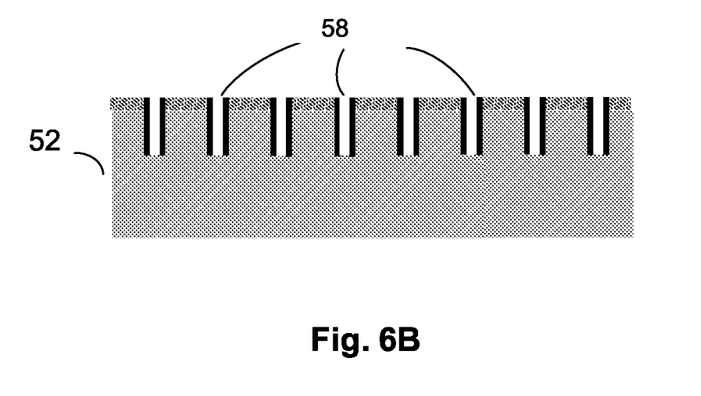
FIG. 6B illustrates etched conformal layer to form spacers on sidewalls of patterned trenches in accordance to the present invention.

Referring to FIG. 6B, the conformal material 56 is etched to form spacers 58 on the sidewalls of the patterned trenches. The removal of the conformal material 56 to form spacers can be accomplished by RIE (Reactive Ion Etching), Ion Milling or similar processes. In accordance to an embodiment of the present invention, the conformal material of silicon nitride is etched using RIE with a suitable gas such as SF6, CHF3 or similar gas. The etching process forms the silicon nitride spacers 58 in the sidewalls of the trenches but removes the conformal material 56 that consists of a silicon nitride layer on the top surface of the substrate as well as the bottom of the trenches. Essentially, only the silicon nitride spacers 58 in the sidewalls remain. It should be noted if the first hard mask layer is also composed of silicon nitride, it is important to maintain the thickness of the first silicon nitride layer is of sufficient thickness to withstand the spacer etch process. The completion of the spacer deposition and etch process protects the sidewalls of the array of trenches while exposing the substrate material GaN at the bottom surface of the trenches. In addition, the top surface as well as the back side of the GaN on SiC substrate (not shown) is protected by the first hard mask layer of silicon nitride. Accordingly, the GaN on SiC substrate includes the patterned array of trenches with sidewalls and top and bottom surfaces protected with a layer of silicon nitride.

Figure 6C:
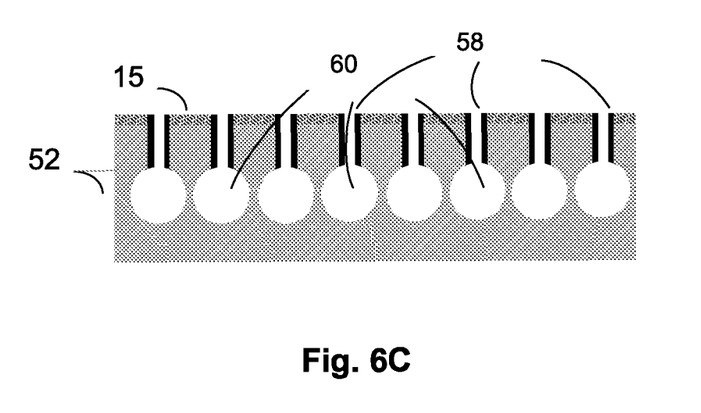
FIG. 6C illustrates etched exposed GaN layer isotropically to form globe shaped openings below the spacer on the sidewalls in accordance to the present invention.

Referring to FIG. 6C, the GaN layer 52 is structured using a Cl$_2$-based dry chemical reactive ion etching process or is immersed into a solution contained KOH solution in a bath. The KOH is of a concentration and temperature suitable to etch the exposed the GaN surface exposed at the bottom of the array of trenches with sidewalls protected by spacers 58 of silicon nitride. The KOH etches the exposed GaN isotropically to form globe shaped openings 60 below the spacer protected trenches. Other etching techniques such as ECE (Electrochemical etching) or PEC (Photoelectrochemical etching) can be used to etch the GaN substrate to form the globe shaped array of openings.

Figure 7A:
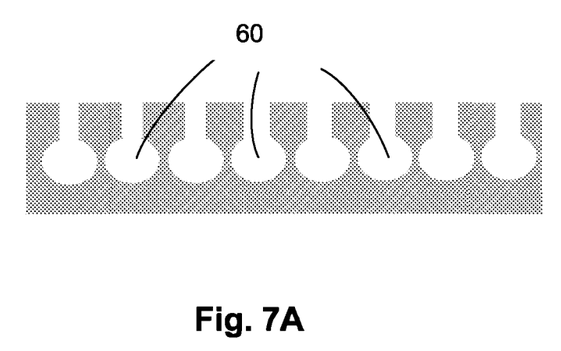
FIG. 7A illustrates the GaN layer after removal of the protective hard mask and spacers on the sidewalls in accordance to the present invention.

In accordance to the present invention, the isotropic etching of the substrate GaN on SiC forms an array of globe shaped opening 60 below a narrow neck formed by the trench and whose sidewalls are protected by the layer of silicon nitride spacers 58. A next step is removal of the protective hard mask and sidewall spacer material 58. Since the hard mask 15 and the silicon nitride spacer 58 are silicon nitride, by immersing the substrate in hot phosphoric acid, the silicon nitride is removed on the top surface of the substrate as well as the sidewalls leaving the globe shaped openings 60 of the trenches as illustrated in FIG. 7A.

Figure 7B:
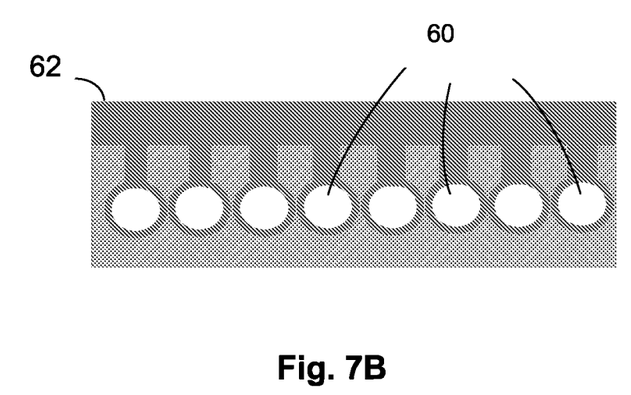
FIG. 7B illustrates epitaxial growth of GaN from the substrate to form a continuous epitaxial layer in accordance to the present invention.

In accordance to an embodiment of the present invention, a next step is epitaxial growth of GaN from the substrate as well as the sidewalls to grow to a thickness sufficient to merge the growth fronts to form a continuous epitaxial layer 62 as illustrated in FIG. 7B. The growth conditions can be adjusted to ensure that the epitaxial fronts merge. The merging of the epitaxial fronts minimizes defect formation of the epitaxial layer 62. The formation of the merged epitaxial layer 62 overgrowth provides a formation of an array of globe shaped openings or voids 60 below the surface and creates an exfoliation layer.

Figure 7C:
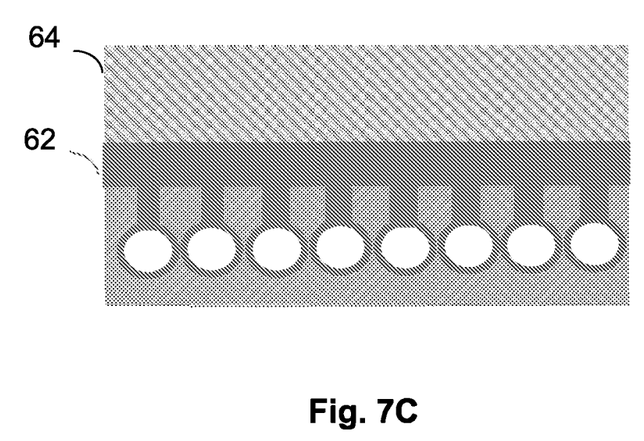
FIG. 7C illustrates growth of a device epitaxial layer over the continuous epitaxial layer in accordance to the present invention.

Referring to FIG. 7C, a next step after formation of the lateral epitaxial layer 62 overgrowth is the growth of a device epitaxial layer 64. The thickness, doping type and concentration is determined by the type of semiconductor device that is to be formed in the device epitaxial layer 64. In some cases, multiple layers of epitaxial semiconductor may be grown for the device epitaxial layer 64.

Figure 8A:
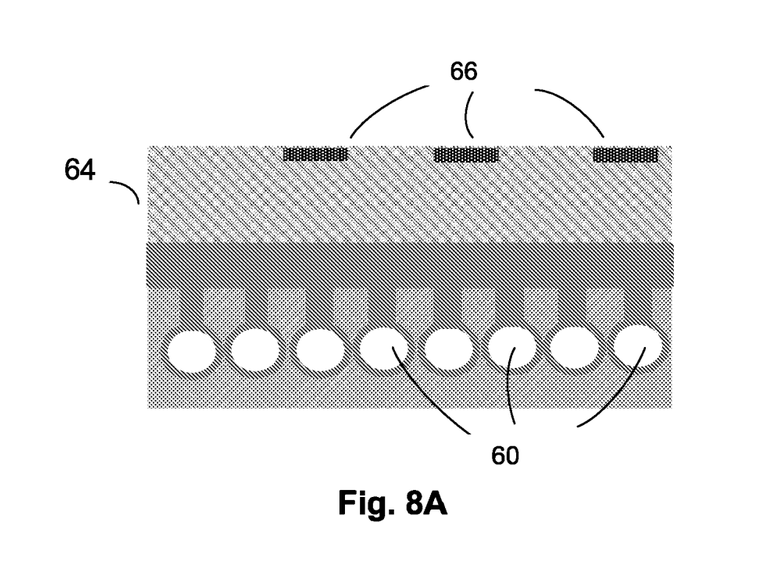
FIG. 8A illustrates formation of semiconductor devices on the device epitaxial layer in accordance to the present invention.

Referring to FIG. 8A, a next step after the formation of the device epitaxial layer 64 is fabrication of various semiconductor devices 66, using designs and processes well known in the art. Devices such as diodes, transistors, light emitting diodes among other devices may be formed in the device epitaxial layer 64. Other devices used for RF, power management, optics, photonics among others can further be formed in the device epitaxial layer 64.

Figure 8B:
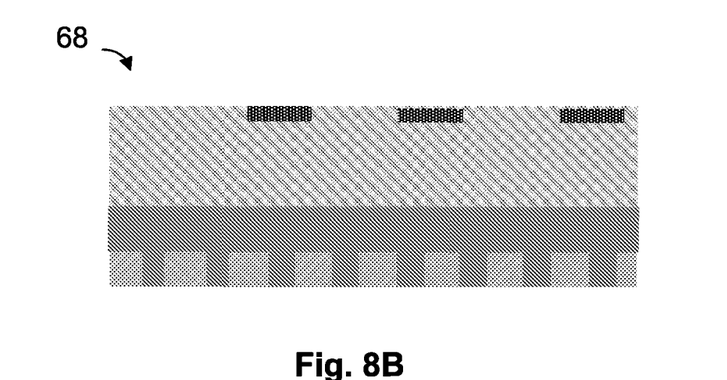
FIG. 8B illustrates the semiconductor devices exfoliated at the array of voids in accordance to the present invention.

After the formation of the semiconductor devices, the devices 68 are exfoliated or severed from the substrate along the array of voids 60 formed below the substrate as illustrated in FIGS. 8A and 8B. Various mechanical and thermal means can be used for the exfoliation or severance from the substrate. One technique is multi-die singulation using laser to separate individual dies from the substrate. Once separated, the surface of the device is polished and metallized as required. The surface of the remaining substrate is polished and reused for formation of other devices.

Once the GaN device layer is extracted, the substrate with the GaN on SiC can be repolished to repeat the above-mentioned device process steps. If the GaN on SiC is of the order of 40-50 microns and the depth with the array of nano-voids is of the order of 2 microns, reuse of the remaining substrate can occur more than 20 iterations. Once the GaN layer has thinned down to approximately 10 microns, it can be thickened again to a thickness of 40-50 microns and the whole process cycle can be repeated. Accordingly, the underlying SiC substrate essentially can be reused again and again. To grow 40-50 microns of GaN, an approach such as Hydride vapor phase epitaxy can be used in a cost-effective manner.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

What is claimed is:

1. A method of forming a plurality of semiconductor devices overlying a substrate that can be used two or more times comprising:
   providing the substrate comprising gallium nitride (GaN) or silicon carbide (SiC);
   forming a merge layer in or below an entire surface of the substrate wherein the merge layer is configured to provide a surface that comprises a majority surface of merged epitaxial lateral overgrowth (MELO);
   forming an exfoliation layer in or below the surface of the substrate;
   growing one or more device layers in an epitaxial reactor overlying the merge layer wherein the one or more device layers are formed by vertical epitaxy;
   forming the plurality of semiconductor devices wherein the substrate is configured to separate from the merge layer at the exfoliation layer; and
   polishing a surface of the substrate after exfoliation to prepare the substrate for reuse.

2. The method of claim 1 further including:
   etching a plurality of trenches in the substrate wherein the plurality of trenches form a plurality of pillars, wherein each pillar of the plurality of pillars has a top surface; and
   growing an epitaxial layer in an epitaxial reactor wherein the epitaxial layer is grown by epitaxial lateral overgrowth, wherein the epitaxial lateral overgrowth extends from sidewalls of the plurality of trenches such that the epitaxial lateral overgrowth merges to form the merge layer.

3. The method of claim 2 further including reducing the top surface area of each pillar of the of the plurality of pillars to reduce dislocation defect propagation to the one or more device layers.

4. The method of claim 2 further including:
   etching the plurality of trenches to form openings comprising square shapes, rectangular shapes, stripes, triangle shapes, or hexagonal shapes;
   growing the substrate, the epitaxial layer, and the one or more device layers single crystal;
   etching the plurality of trenches having a depth from 1000-5000 Angstroms and having a width in the range of 500-5000 Angstroms.

5. The method of claim 2 further including:
   patterning the substrate with a mask layer prior to etching the plurality of trenches;
   depositing a conformal material overlying the substrate wherein the conformal material is configured to overlie sidewalls of the plurality of trenches;
   etching the conformal material such that the conformal material remains overlying sidewalls of the plurality of trenches but exposes a bottom of each trench of the plurality of trenches; and
   isotropically etching the substrate in exposed areas at the bottom of each trench of the plurality of trenches to form a plurality of globe shape openings wherein the plurality of globe shape openings comprise the exfoliation layer.

6. A method of forming a plurality of semiconductor devices overlying a substrate that can be used two or more times comprising:
   providing the substrate comprising silicon carbide or gallium nitride;
   forming a merge layer in and below a surface of the substrate wherein a plurality of trenches are etched in the merge layer;
   an exfoliation layer formed underlying the surface of the substrate;
   growing an epitaxial layer by epitaxial lateral overgrowth having the same crystal orientation as the substrate wherein a surface of the epitaxial layer comprises merged epitaxial lateral overgrowth (MELO) extending from sidewalls of the plurality of trenches;
   growing one or more device layers formed by vertical epitaxy overlying the first epitaxial layer wherein the one or more device layers have the same crystal orientation as the first epitaxial layer; and
   forming the plurality of semiconductor devices on or in the one or more device layers.

7. The method of claim 6 further including:
   patterning the substrate with a mask layer prior to etching the plurality of trenches;
   depositing a conformal material overlying the substrate wherein the conformal material is configured to overlie sidewalls of the plurality of trenches;
   etching the conformal material such that the conformal material remains overlying sidewalls of the plurality of trenches but exposes a bottom of each trench of the plurality of trenches; and
   isotropically etching the substrate in exposed areas at the bottom of each trench of the plurality of trenches to form a plurality of globe shape openings wherein a predetermined width of the substrate exists between adjacent globe shaped openings.

8. The method of claim 7 further including:
   separating the substrate from the from the merge layer by mechanical or thermal processes wherein the separation occurs at the exfoliation layer;
   polishing a surface of the substrate after the exfoliation such that the substrate is prepared for reuse; and
   polishing a surface of the merge layer after the exfoliation for subsequent processing steps to complete the plurality of devices.

9. The method of claim 6 further including:
   patterning the plurality of trenches in the substrate to form a plurality of pillars wherein each pillar of the plurality of pillars has a top surface;
   polishing the merge layer such that the surface of the merge layer comprises the top surface of each pillar of the plurality of pillars and the merged epitaxial lateral overgrowth; and
   reducing the top surface area of each pillar of the plurality of pillars to maximize the surface of the merged epitaxial lateral overgrowth of the merge layer to reduce propagation of dislocation defects.

10. The method of claim 9 further including patterning the plurality of trenches in a range of 1000-5000 Angstroms in depth wherein the plurality of trenches are configured to be in a form of lines, hexagons, rectangles, or squares and wherein an opening of the plurality of trenches are configured to have a width in the range of 500-5000 Angstroms.

* * * * *